(12) United States Patent
Murphy (10) Patent No.: US 7,196,646 B2
(45) Date of Patent: Mar. 27, 2007

(54) COMPLEMENTARY TRANSISTOR COMPARING CIRCUITS FOR TIME-TO-THRESHOLD A/D CONVERSION IN DIGITAL IMAGING ARRAYS

(76) Inventor: Charles Douglas Murphy, 601 Linden Pl., #210, Evanston, IL (US) 60202

( * ) Notice: Subject to any disclaimer, the term of this patent is extended or adjusted under 35 U.S.C. 154(b) by 0 days.

(21) Appl. No.: 11/491,751

(22) Filed: Jul. 24, 2006

(65) Prior Publication Data

US 2006/0255984 A1    Nov. 16, 2006

Related U.S. Application Data

(63) Continuation of application No. 10/804,024, filed on Mar. 19, 2004, now Pat. No. 7,126,512.

(51) Int. Cl.
*H03M 1/12* (2006.01)

(52) U.S. Cl. ........................ 341/137; 341/155

(58) Field of Classification Search .................. 341/137
See application file for complete search history.

(56) References Cited

U.S. PATENT DOCUMENTS

| | | | | |
|---|---|---|---|---|
| 6,333,709 | B2 * | 12/2001 | Miyamoto | ................... 341/158 |
| 6,850,176 | B2 * | 2/2005 | Laflaquiere et al. | ........ 341/137 |
| 7,023,221 | B1 * | 4/2006 | Lin | ........................... 324/662 |
| 7,098,437 | B2 * | 8/2006 | Ishikawa et al. | .......... 250/208.2 |

* cited by examiner

*Primary Examiner*—James H. Cho (57) ABSTRACT

Inverters are efficient array-internal threshold detectors or comparators in digital imaging systems which use time-to-threshold A/D conversion, particularly CMOS image sensor arrays. The inverters compare sensor outputs to implicit inverter thresholds, with inverter outputs switching on threshold crossings. The inverters can have constituent transistors of with minimum size. Alternatively, non-minimum transistor dimensions can be selected to obtain desired threshold levels. Other logic circuits can also act as threshold detectors.

25 Claims, 7 Drawing Sheets

COMPLEMENTARY TRANSISTOR COMPARING CIRCUITS FOR TIME-TO-THRESHOLD A/D CONVERSION IN DIGITAL IMAGING ARRAYS

CROSS-REFERENCE TO RELATED APPLICATIONS

The application is a continuation of the pending application COMPARING CIRCUITS FOR TIME-TO-THRESHOLD A/D CONVERSION IN DIGITAL IMAGING ARRAYS having application Ser. No. 10/804024 and filing date Mar. 19, 2004 now U.S. Pat. No. 7,126,512. The application is related to U.S. Pat. No. 6,559,788 entitled PARALLEL AND SHARED PARALLEL ANALOG-TO-DIGITAL CONVERSION FOR DIGITAL IMAGING issued on May 6, 2003 to the applicant. The application is also related to U.S. Pat. No. 6,873,282 entitled DIFFERENTIAL TIME-TO-THRESHOLD A/D CONVERSION IN DIGITAL IMAGING ARRAYS issued on Mar. 29, 2005 to the applicant.

STATEMENT REGARDING FEDERALLY SPONSORED RESEARCH OR DEVELOPMENT

Not applicable

REFERENCE TO A MICROFICHE APPENDIX

Not applicable

BACKGROUND—FIELD OF INVENTION

The invention relates to digital imaging with time-to-threshold A/D conversion, particularly to low-cost, low-complexity structures for converting analog sensor outputs to digital indicator signals in CMOS image sensor arrays.

BACKGROUND—DESCRIPTION OF PRIOR ART

Many digital imaging systems employ arrays of sensors. Often, the arrays consist of rows and columns of sensors. The sensors are exposed to incident energy either simultaneously or nearly so. The incident energy causes physical parameters of the sensors to change, typically analog electrical parameters such as currents or voltages. Subsequently, the parameter changes are converted into digital number values using some form of analog-to-digital (A/D) conversion.

In much of the prior art, digital imaging systems use essentially the same approach as film-based cameras. The sensors are configured to produce an output change proportional to the cumulative incident energy during a common exposure time of pre-selected duration. A/D conversion takes place after exposure and outside the array boundaries.

For CCD imaging systems, this external A/D conversion is necessary because CCD arrays and mixed-signal A/D converters are fabricated using different manufacturing processes and consequently are on separate chips. However, in CMOS technologies, it is possible to co-fabricate sensors and other circuitry on a single chip.

When A/D conversion is a separate process from analog signal acquisition, one can use a general-purpose A/D converter. Such converters are widely known in the prior art, and are general-purpose because they do not rely on specific knowledge of how analog inputs are acquired. Given a voltage or a current in a specified range as an analog input, they provide a digital output with a specified number of bits of precision in a specified amount of time.

There are numerous types of general purpose A/D converters, including those based on charge-balancing, on successive approximation, and on flash or half-flash techniques. Choice of a particular strategy usually involves a trade-off between cost and speed or precision, where cost may be measured in terms of chip space, power consumption, or extra manufacturing steps (such as laser trimming to match components, or tuning using floating gates).

As an example, consider flash conversion. The basic idea of flash conversion is to simultaneously compare an unknown analog input to a set of known reference levels. Usually the levels are uniformly spaced. For each level a comparator indicates whether it is greater than or less than the unknown analog input. The set of comparator outputs forms a thermometric code that is interpreted much the same way as the markings on an old-fashioned glass thermometer.

A flash converter with N bits of precision requires ($2^N-1$) comparators and known reference levels. Traditionally, the reference levels were generated using a chain of $2^N$ resistors strung between minimum and maximum reference voltages. Except for the end resistors, all the resistors have the same value. (See, for example, FIG. 9.49 on page 621 of THE ART OF ELECTRONICS, fourth edition.)

In practice, such resistors aren't perfectly matched, which is an impediment to high-precision conversion. An even greater impediment is the exponential component count.

One clever flash converter idea that is apropos to the present work is the so-called "threshold inverter quantizer" (TIQ) proposed by K. Choi and his colleagues at Penn State University. They recognized that matched resistors are quite costly to produce in CMOS—being physically very large and/or needful of trimming—whereas transistors with accurate width-to-length ratios are both cheaper (e.g. smaller) and easier to produce.

Consequently, Choi et al. put forth the idea of replacing the resistor chain and comparators with a set of scaled CMOS inverters. Each inverter has one input, but component transistors scaled to provide digital output transitions at different input levels—a useful departure from the standard practice of designing inverters to switch mid-way between their power supply rails. Notwithstanding the improvement over traditional flash converter architectures, the approach suffers from an increasing average inverter size as precision increases and also from exponential component count.

Generally speaking, fast, high-precision A/D converters are much more costly than slow, high-precision A/D converters or fast, low-precision A/D converters. Unfortunately, digital imaging arrays with millions or tens of millions of sensors may require large numbers of conversion operations in very short time intervals. Hence some form of fast, high-precision A/D conversion is very desirable.

Time-to-threshold A/D conversion exploits some of the unique features of digital imaging systems, in particular sensors that act as integrators. With time-to-threshold A/D conversion in a digital imaging system, a digital number value is generated as a measured elapsed time required for a sensor output to change from some initial level to some threshold level. This type of A/D conversion is well-suited to parallel implementations and occurs in real time as the sensors are being exposed to incident energy.

Several U.S. patents describe various types of time-to-threshold A/D conversion for digital imaging, including U.S. Pat. No. 5,650,643 issued to K. Konuma, U.S. Pat. No. 6,587,145 issued to A. Hou, and U.S. Pat. No. 6,559,788 issued to C. Murphy. The advantages and disadvantages of some of these patents are described in U.S. Pat. No. 6,680,498 issued to R. Guidash.

Konuma proposed having a master clock signal passed into an array, with each sensor's output governing a dedicated counter. Massive counter redundancy leading to high power consumption and large chip area is a major disadvantage of this approach.

Hou proposed a two-transistor comparator with two inputs—one from a pinned photodiode, applied at the gate of one transistor, and the other from an array-external reference source passed into the array and applied to the gate of the other transistor. The two transistors pass current simultaneously, in effect wrestling for control of a common circuit node which is the comparator output. This leads to high power consumption. Also, the accuracy of the reference signal in setting the threshold level depends on the relative gains of the component transistors.

Another patent, U.S. Pat. No. 5,461,425 issued to B. Fowler and A. El Gamal, describes an early proposal for putting A/D converters in an imaging array as a way of avoiding having to pass analog signals to array-external A/D converters. However, their proposed A/D converters are still quite costly, and not based on time-to-threshold conversion.

There is clearly a need for circuits that enable time-to-threshold A/D conversion with very low cost—by part count, part size, power consumption, and other measures.

SUMMARY

The present invention is a time-to-threshold A/D conversion structure for image sensors, with CMOS digital logic or logic-type circuits, such as inverters, for comparing sensor signal levels to implicit threshold levels.

OBJECTS AND OBJECTIVES

There are several objects and objectives of the present invention.

It is an object of the present invention to demonstrate that CMOS digital logic circuits are useful as array-internal comparators in imaging arrays which employ time-to-threshold A/D conversion, especially in area-efficient image sensor cells with small component counts.

It is another object of the present invention to demonstrate that CMOS logic gates with minimum-size transistors are suitable as local threshold detectors, resulting in area-efficient sensor cells.

It is a further object of the present invention to show that a CMOS inverter is a very efficient circuit for threshold detection.

It is a further object of the present invention to show that CMOS logic gates with p-type transistors tied to the positive power supply voltage and n-type transistors supplied to the power supply ground, while digitally inefficient, are nonetheless suitable as threshold detectors for time-to-threshold A/D conversion.

Further objects and advantages of the invention will become apparent from a consideration of the ensuing description.

REFERENCE NUMERALS IN DRAWINGS

10 a photodiode
12 a ground wire
14 a reset transistor
16 a reset reference bus
18 a positive power supply bus
20 an inverter
22 a digital inverter output
24 a p-type transistor
26 an n-type transistor
28 an amplifying transistor
30 a bus access transistor
32 an analog signal bus
34 a p-type reset transistor
36 array boundary
38 a counter
40 a column line conditioner
42 bi-directional bus
44 a power supply
46 a reference and control signal generator
48 a digital memory block

DESCRIPTION—THE PREFERRED EMBODIMENT OF THE INVENTION

Figure 1A:
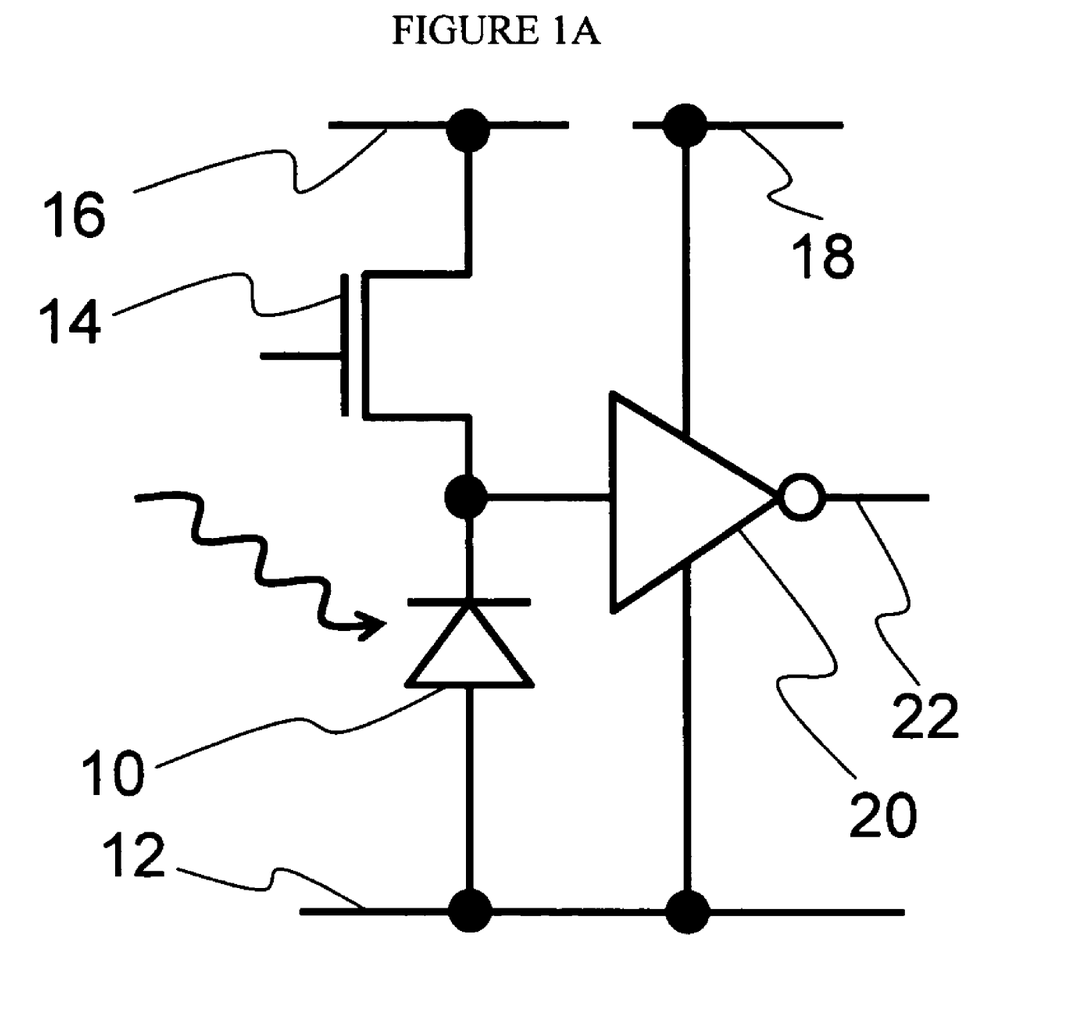
FIG. 1A shows a pinned photodiode driving an inverter.

The preferred embodiment of the invention is a CMOS inverter used as a threshold detector circuit in a CMOS image sensor cell, as shown in FIG. 1A. Ordinarily, a CMOS inverter is treated as a digital circuit which provides a logic 0 output given a logic 1 input and logic 1 output given a logic 0 input. However, in this case it acts as a single-input comparator, effecting an implicit comparison of an input signal to the level at which the output changes state.

FIG. 1A depicts a photodiode 10 connected to a ground wire 12 and a reset transistor 14. Reset transistor 14 is connected to reset reference bus 16. Photodiode 10 is also connected to the input of an inverter 20. Inverter 20 has positive power supply bus 18 and ground wire 12 as power rails, and provides a digital indicator signal at digital inverter output 22. The output of inverter 20 is connected to a count recorder not shown in the figure.

In actual operation, reset transistor 14 is switched on to pull the voltage across photodiode 10 up to the voltage on reset reference bus 16. Reset transistor 14 is then switched off and photodiode 10 is exposed to incident energy. Photogeneration of electron-hole pairs causes the voltage across photodiode 10 to change. The change is proportional to the cumulative incident energy. In other words, photodiode 10 acts as an integrator.

Inverter 20 has this voltage as an input. Digital inverter output 22 begins in a logic 0 state but switches to a logic 1 state given a sufficiently large drop in the input voltage.

The digital indicator signal of digital inverter output 22, in turn, governs the count recorder, triggering recording of an elapsed time since the last reset. This elapsed time is the desired digital output of the time-to-threshold A/D conversion process.

In various embodiments, the count recorder might be a counter itself or a register which latches onto a count provided by a master counter. Ideally, it is local to inverter 20, which is itself local to photodiode 10 and reset transistor 14. This approach enables design of sensor cells with low-cost in-cell circuits for processing analog sensor outputs rather than high cost external circuits. Analog signals from the sensors or amplified versions of the same are not passed over long distances.

Figure 1B:
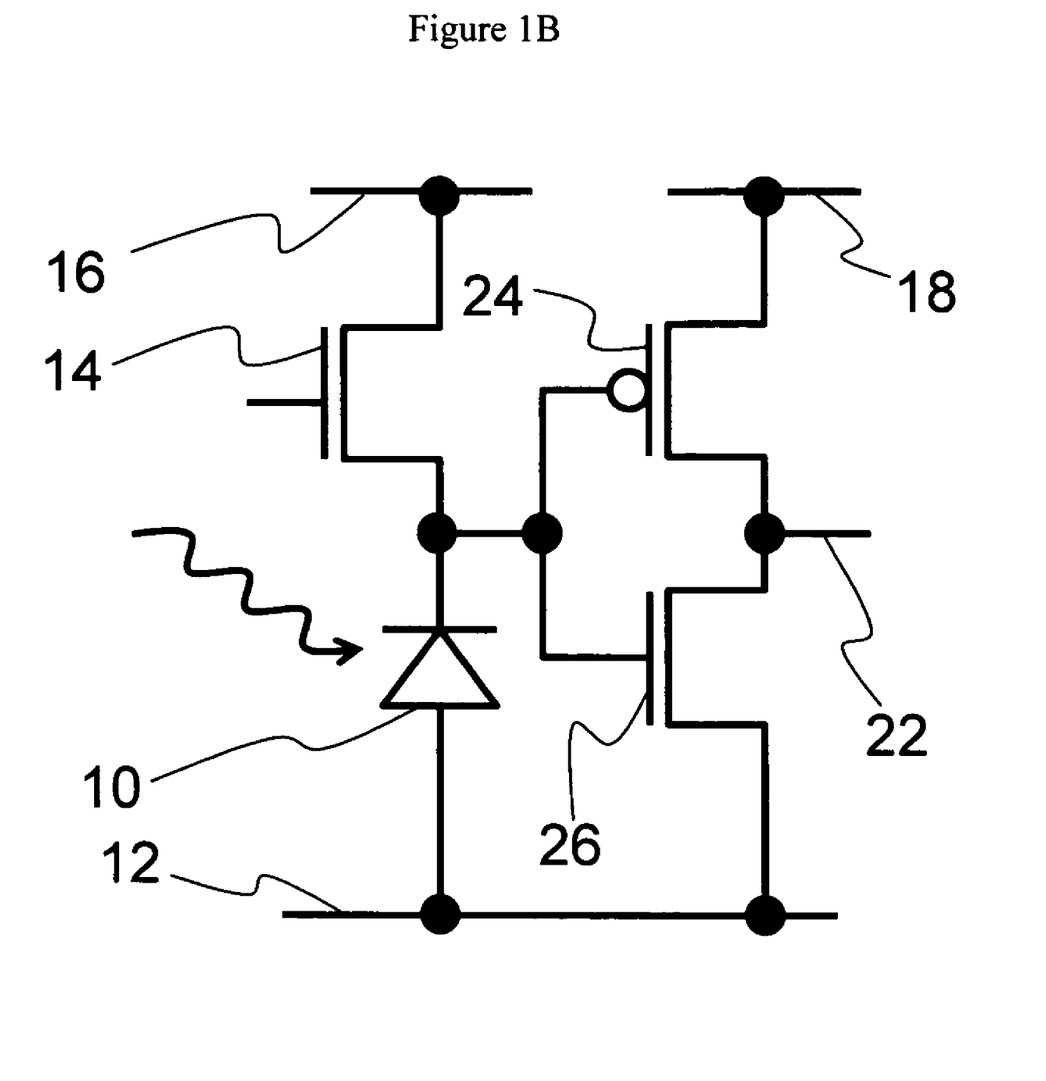
FIG. 1B shows a pinned photodiode driving an inverter composed of two MOSFETS.

FIG. 1B shows the inverter of FIG. 1A formed from a p-type transistor 24 and an n-type transistor 26. P-type transistor 24, a MOSFET, acts to "pull up" the node of digital inverter output 22. N-type transistor 26, also a MOSFET, acts to "pull down" the node of digital inverter output 22. Together, the two transistors form a CMOS inverter, which is a well-known type of digital logic gate.

Description—Alternative Embodiments with Minimum Transistor Sizes

In MOS transistor technologies, transistor gain depends on carrier mobility—for n-type transistors, electron mobility and for p-type transistors, hole mobility. In standard fabrication processes, hole mobility is about half that of electron mobility (or less). As a consequence, n-type transistors have approximately twice (or more) the gain of p-type transistors with the same dimensions.

In digital logic, it is often desired that the output transition between binary logic levels occur when the input is midway between the power supply levels. For instance, if Vdd is the positive power supply voltage and Vss is the ground supply voltage, the output transition should occur when the input reaches (Vdd−Vss)/2. To accomplish this p-type transistors are made with a larger (e.g. twice or more) channel width-to-length ratio than their n-type counterparts, compensating for the carrier mobility differences.

An alternative embodiment of the present invention uses digital logic gates with minimum-size transistors. This results in a saving of chip area at the cost of an offset threshold level. In the case of an inverter, the output transitions when the input is greater than (Vdd−Vss)/2, with minimum-size transistors.

In the context of an imaging array, a primary concern is that the sensor output actually triggers threshold detection during exposure. In part this is a matter of having an appropriate maximum measurable exposure time in ordinary incident energy conditions. However, it is also aided by initializing the sensor outputs to levels suitably close to the levels at which the threshold detector outputs change. Minimum-size transistors naturally enable this, as do the ideas discussed in the related work DIFFERENTIAL TIME-TO-THRESHOLD A/D CONVERSION IN DIGITAL IMAGING ARRAYS.

Choi et al. used inverters with non-midpoint transitions as single-input comparators in flash A/D conversion, as embodied by their TIQ converter. However, the inverters were intended to provide a set of comparators processing each unknown analog input to the converter. In contrast, the present invention proposes a set of inverters each of which processes a single sensor output. The inverters operate in parallel as threshold detectors. Ostensibly they have a single common threshold, in an array of replicated standard sensor cells. Ways of dealing with poor threshold matching are dealt with in DIFFERENTIAL TIME-TO-THRESHOLD A/D CONVERSION IN DIGITAL IMAGING ARRAYS.

Description—Alternative Embodiments with Other Prior Art Digital Logic Circuits

Inverters are not the only digital logic gates suitable for the present invention, though they are the smallest and least-complicated. There are many different types of digital logic gates that can be used in the present invention, such as AND, OR, NAND, NOR, XOR, and other gates. Many of these gates have more than one input, often two in their simplest forms.

A two-input digital logic gate would be useful in synchronizing operation of the threshold detector. For instance, a 2-input AND gate could have as one input a sensor output and as the other input a control signal indicating when the detector should operate. The AND gate output would switch only with the control signal in a logic 1 state and given a suitable sensor output change.

Logic gates can also be used to emulate other logic gates, particularly in technologies such as field-programmable gate arrays. For instance, applying the same signal to both inputs of a 2-input NAND gate produces the same digital input-output response as an inverter.

Description—Alternative Embodiments with Novel Digital Logic Circuits

Typical CMOS digital logic gates include one or more p-type transistors pulling a given output node up toward the positive power supply voltage (e.g. to a logic 1) and one or more n-type transistors pulling a given output node down toward the negative power supply voltage or ground (e.g. to a logic 0). The digital logic gate input node includes connections to two or more transistor gates.

The reason for using p-type pull-up transistors and n-type pull-down transistors is that p-type transistors enter cut off before pulling down all the way to ground, while n-type transistors enter cut off before pulling up all the way to the positive power supply rail. In this case logic 1 and logic 0 output levels are separated by the full power supply difference less the p-channel and n-channel cutoff threshold voltages rather than by the full power supply difference. The reduced separation is not desired in digital logic.

However, in the context of the present invention, a "non" inverter formed by a pull-up n-type transistor and a pull-down p-type transistor can perform threshold detection. The "non" inverter provides a logic 1 output given a logic 1 input and a logic 0 output given a logic 0 input, though the actual output voltage levels are subject to the n-channel and p-channel threshold voltage effects.

Figure 1C:
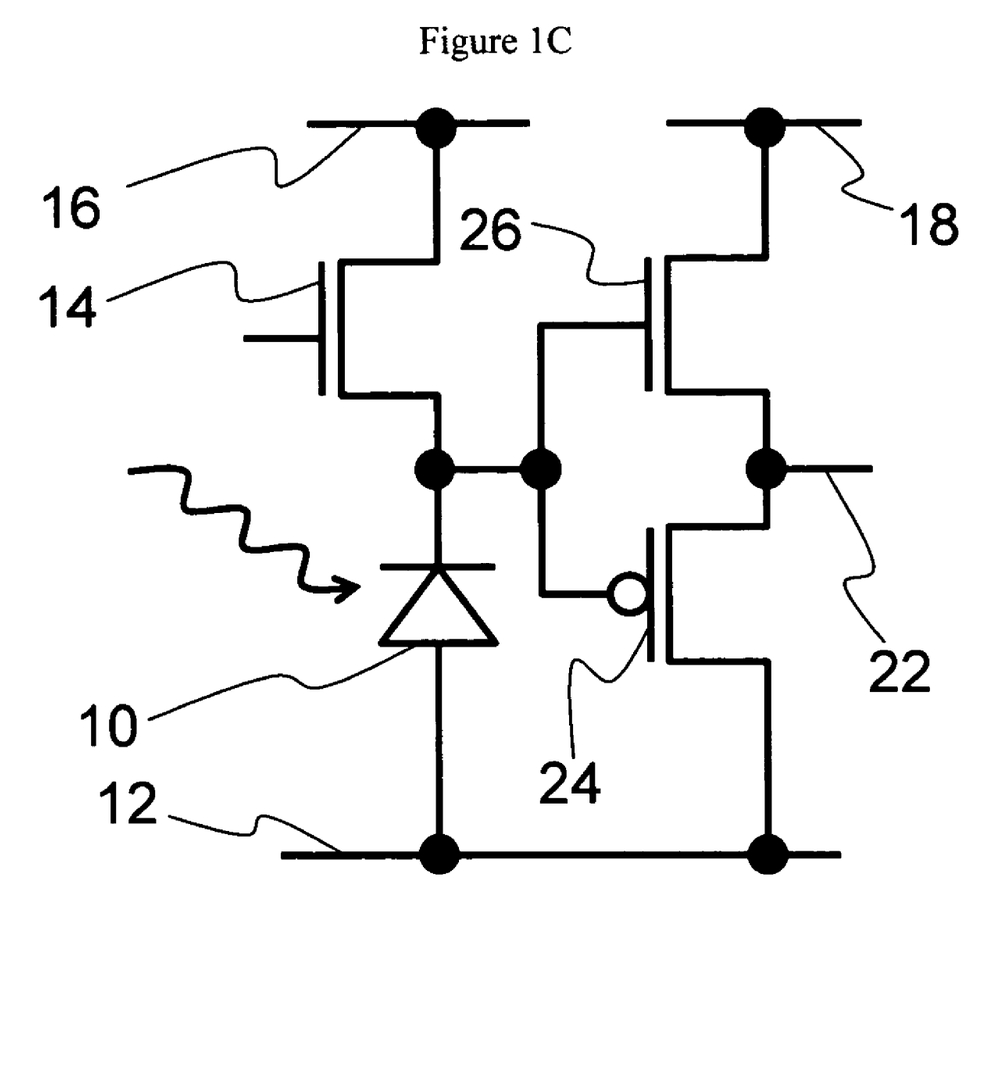
FIG. 1C shows a pinned photodiode driving a two-transistor non-inverting circuit suitable as a threshold detector.

FIG. 1C shows such a "non" inverter realized with the same set of components as an orthodox CMOS inverter. In FIG. 1C, n-type transistor 26 is directly connected to positive power supply bus 18, and p-type transistor 24 is directly connected to ground wire 12. N-type transistor 26 pulls the voltage of digital inverter output 22 up, while p-type transistor 24 pulls the voltage of digital inverter output 22 down.

The characteristics of CMOS inverters and other digital logic gates are well-known in the prior art. For instance, the university textbook PRINCIPLES OF CMOS VLSI DESIGN, second edition, by N. H. E. Weste and K. Eshraghian has extensive discussion of MOS transistors and CMOS in digital circuits. FIG. 2.16 on page 70 discusses noise margins of CMOS inverters, while page 71 explains that "the CMOS inverter when used as a logic element is in reality an analog amplifier operated under saturating conditions".

In the present invention, the idea is to use inverters or other digital logic gates driven—as analog sensor outputs change—into saturation.

Description—A Prior Art CMOS Active Pixel Sensor

Figure 2A:
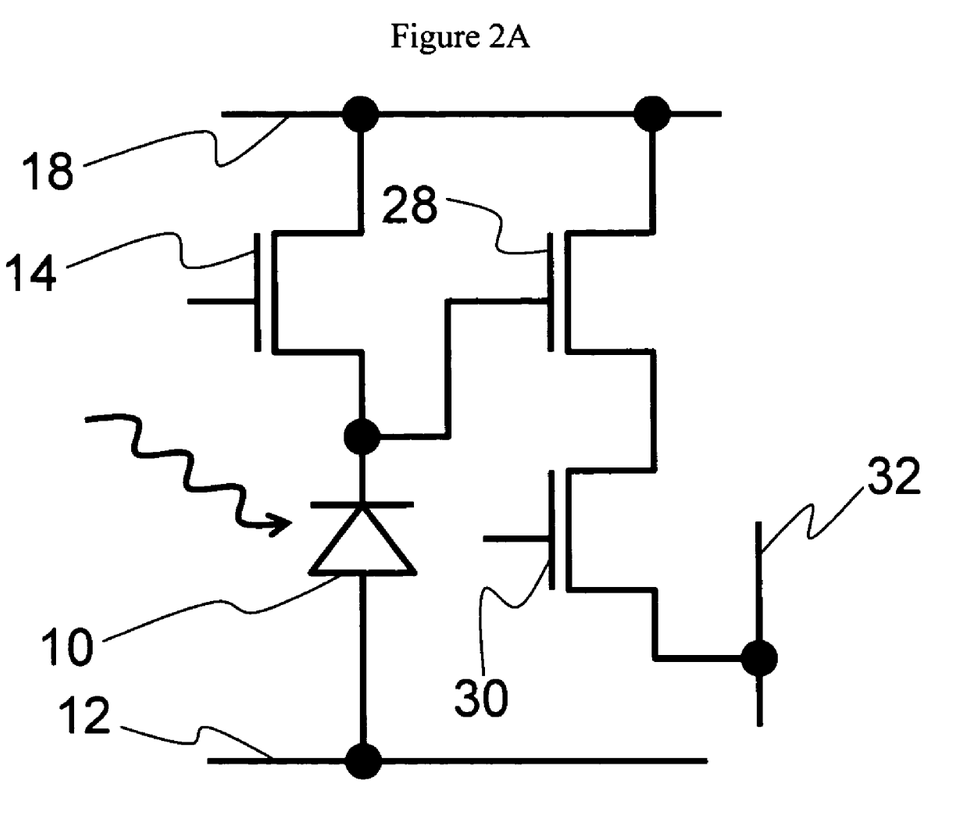
FIG. 2A shows a prior art CMOS active pixel sensor (APS) cell schematic.

FIG. 2A shows a schematic for a popular 3-transistor APS cell of the prior art. The sensing element is a photodiode 10 connected between a ground wire 12 and a reset transistor 14. Reset transistor 14 is connected to positive power supply bus 18. The common node of reset transistor 14 and photodiode 10 is connected to the gate of an amplifying transistor 28. Amplifying transistor 28 is connected to power supply bus 18 and to a bus access transistor 30, which in turn is connected to an analog signal bus 32.

The three transistors in this cell are all n-type transistors, and the cell is termed "active" due to the presence of amplifying transistor 28.

In operation, reset transistor 14 is used to initialize the output of photodiode 10 to a voltage near that of positive power supply bus 18. The sensor is then exposed to light for a period of time common to all sensors in the array. Amplifying transistor 20 provides some signal gain, with the amplified result selectively applied to analog signal bus 32 by bus access transistor 30.

The cell is replicated to form rows and columns of an array. Cells on the same column share analog signal bus 32—hence the presence of bus access transistor 32—and cells in the same row may share reset control, bus access control, and power supply wires (e.g. ground wire 12 and positive power supply bus 18).

There are several advantages to this prior art. There are a small number of transistors, all of which are n-transistors. Small n-transistors can provide better gain than p-transistors of equivalent size, and in n-well manufacturing processes don't require wells. The cells require a small number of power, control, and data access wires running straight across cell rows or columns in an array.

On the other hand, there are also some disadvantages to such a structure. One is that shared analog signal bus 32 may be a long metal wire running alongside other shared signal bus wires over a long distance. Analog signal bus 32 carries analog signals rather than digital signals. The acquired analog signals may thus be prone to noise, cross-talk, and other unwanted distortions. Also, if a large number of APS cells share analog signal bus 32, having near-simultaneous outputs from each of those cells in the final digital image implies relatively fast serial A/D conversion and either fast row-serial exposure or means for blocking incident energy after fully simultaneous exposure.

Description—More Sensor Cell Architectures

In FIG. 1A, 1B, and IC, reset transistor 14 is an n-type transistor connected to reset reference bus 16. This bus could be identical to positive power supply bus 18, but may instead be a separate bus. A separate reset reference bus 16 would be useful for timely initialization and also for the techniques discussed in DIFFERENTIAL TIME-TO-THRESHOLD A/D CONVERISON IN DIGITAL IMAGING ARRAYS.

FIGS. 1B and 1C each show a p-type transistor 24, which is a departure from the prior art APS cell with its single transistor type. While digital logic circuits can be made without using both n-type and p-type MOS circuits, the CMOS approach with both types is efficient, which is why it is dominant in digital chip designs.

Figure 1D:
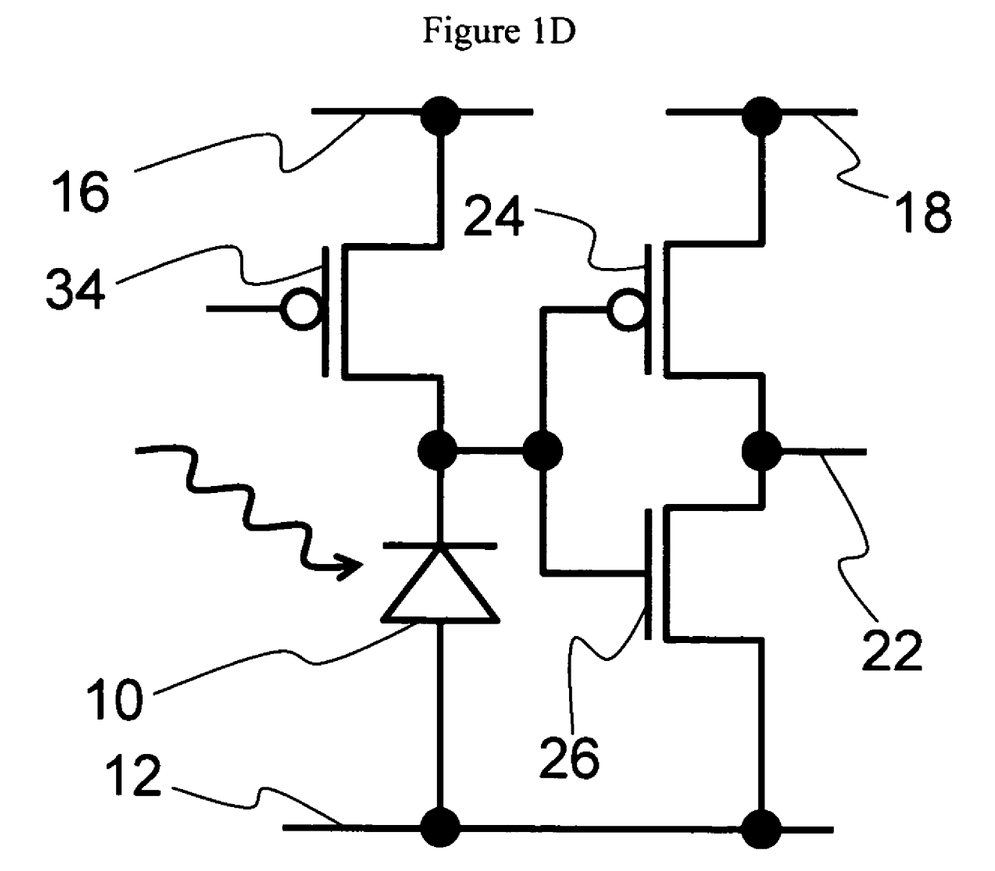
FIG. 1D shows a pinned photodiode with a p-type pull-up reset transistor, driving an inverter.

The present invention proposes moving digital logic gates into array cells, so it is natural to use CMOS logic structures. This implies the presence of at least one well in the sensor cell—in an n-well process, for p-type transistor 24. However, having noted the shortcomings of n-type MOS transistors as pull-up devices, an alternative embodiment might substitute a p-type transistor in place of the n-type transistor depicted for reset transistor 14 in FIGS. 1B and 1C. This is shown in FIG. 1D, with p-type transistor 34.

It's also worth noting that there are twin-tub or silicon-on-insulator processes that are emerging competitors of older single-well fabrication processes. These new technologies require wells for both n-type and p-type transistors, so the reasons for using only n-type transistors may become less compelling.

Figure 1E:
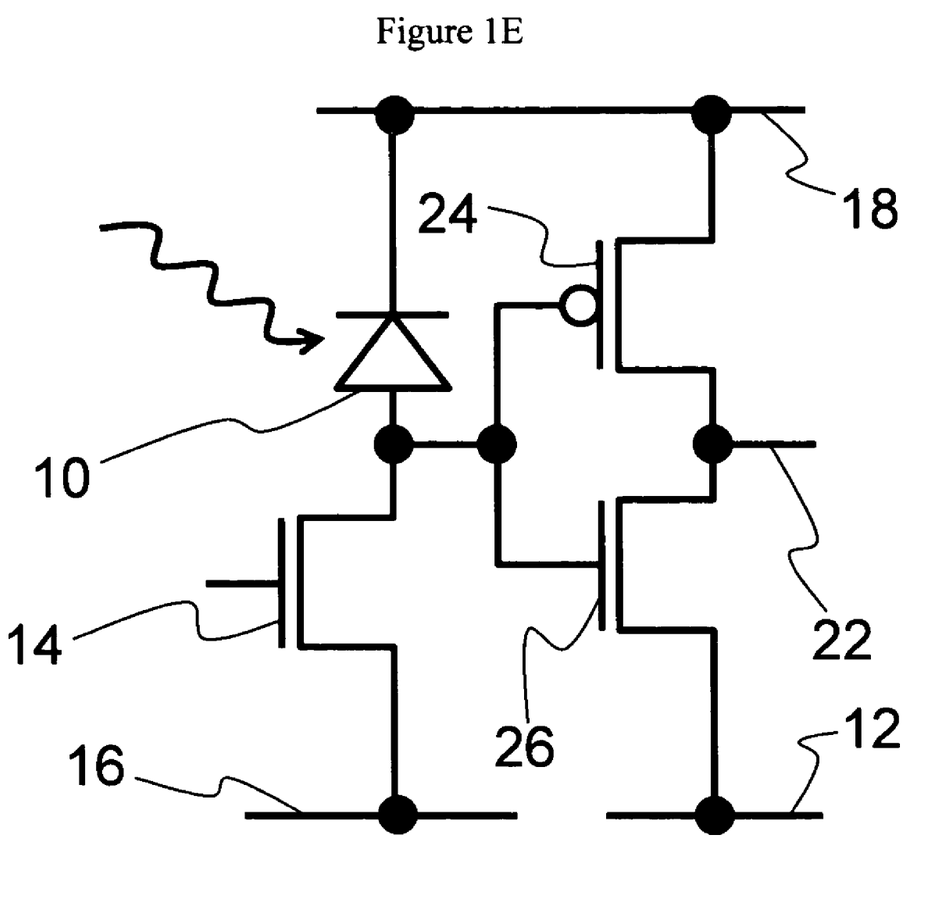
FIG. 1E shows a pinned photodiode with an n-type pull-down reset transistor, driving an inverter.

In yet another embodiment, the positions of photodiode 10 and reset transistor 14 in FIGS. 1A, 1B, and 1C might be switched, so that photodiode 10 is connected between reset reference bus 16 and reset transistor 14, with reset transistor 14 pulling down to the voltage on ground wire 12. Then reset transistor 14 could be an n-type MOSFET—with higher gain relative to size than a p-type transistor—pulling down instead of up, and thus avoiding the cut-off issue. This is depicted in FIG. 1E. Note that in FIG. 1E reset reference bus 16 may be identical to ground wire 12, or may be a separate line providing a higher voltage than ground wire 12.

Also note that all of the cell architectures depicted in FIGS. 1A through 1E can be modified to incorporate additional digital logic gates for other functions (e.g. count recording) or as the threshold detector. While not shown, another important feature may be incorporation of a hysteresis mechanism to prevent wild back-and-forth swings of the threshold detector's digital indicator signal while the sensor output is in the process of passing (perhaps slowly relative to digital logic speeds) the level at which the indicator is supposed to switch states.

Description—Alternative Embodiments with Multiple Sensors

While most of the embodiments discussed above were presented with reference to one sensor and corresponding threshold detection circuitry, the present invention is particularly intended for use in large sensor arrays.

At the moment, the most promising technology for deployment is CMOS, which enjoys numerous advantages including process improvements driven by digital circuit research, low manufacturing cost, low power consumption, and single-chip digital and mixed-signal circuits. CMOS image sensor arrays now in production for mass consumption have a few million up to 10 million or more pixels. The cost reductions in single sensor cells become significant when the cells are replicated to form an array.

Further cost reductions may be possible from combining threshold detectors. For instance, a digital logic gate computing ((A AND S1) OR (NOT(A) AND S2)) could have A being a control signal determining whether the threshold detector output indicates the state of a first sensor output S1 or the state of a second sensor output S2. Of course, the detector would need to be accessed twice per elapsed time count value.

Figure 2B:
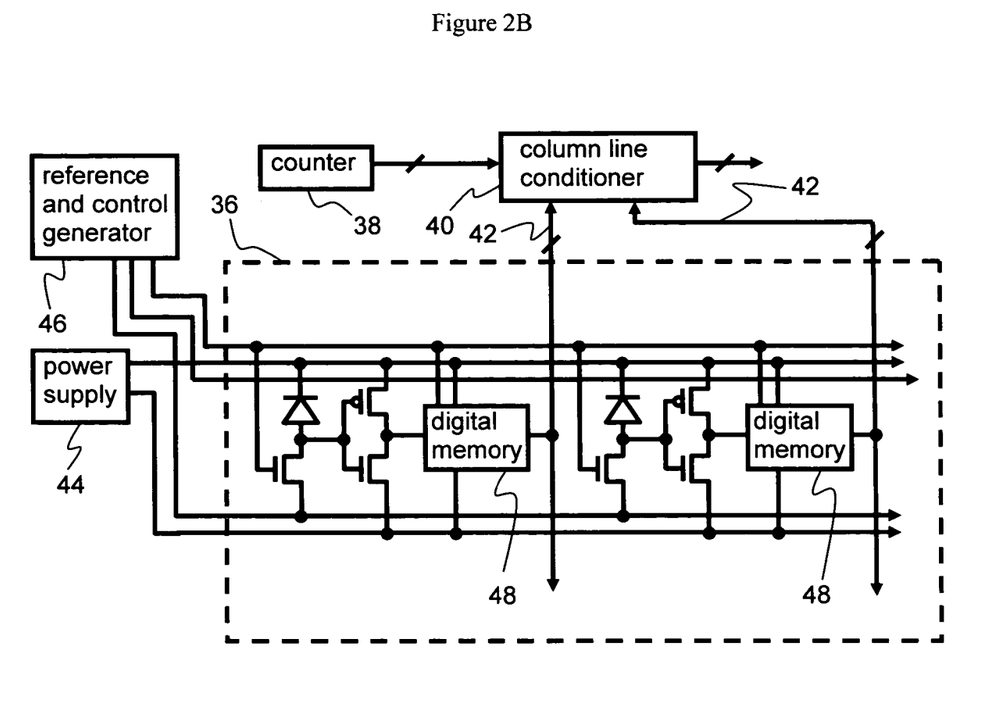
FIG. 2B shows sensor cells with inverters for threshold detection in an array.

FIG. 2B shows a embodiment of the present invention in an array defined by array boundary 36. Externally, a counter 38 tracks elapsed time. The digital count signals are provided to the sensors in the array via a column line conditioner 40. Each sensor cell is connected to column line conditioner 40 via a bidirectional bus 42. Also external to the array are a power supply 44 and a reference and control signal generator 46.

Each cell is composed of a photodiode, an n-type reset transistor, a CMOS inverter acting as a threshold detector, and a digital memory block 48. As shown, the n-type resistors pull down to the signal on a reference signal bus supplied by reference and control signal generator 46, rather than to a power supply ground. The reset control line is shown connected to each digital memory block 48 as well as to the reset transistors.

Digital memory block 48 may include some control logic for determining when to latch onto a count provided on the attached bi-directional bus 42, digital memory circuits for storing one (or more) count values, and control circuitry for passing recorded counts out of the sensor cell on the attached bi-directional bus 42. Note that depending on the desired functionality, there may be additional control signals used other than the single reset control shown.

Within array boundary 36 there may be many more sensor cells than shown, in rows and columns. Each bi-directional bus 42 need not feed a single column of sensor cells. Similarly, the control signal, reference signal, and power supply buses need not feed single rows of sensor cells. Column sharing and row sharing of the connections are possible, as are various types of dendrite architectures.

Conclusion, Ramifications, and Scope

The reader will see that the present invention has several advantages over prior art techniques. Using the present invention, it is possible to implement time-to-threshold A/D conversion in an imaging array using low-cost components whose design and performance are well-characterized in the prior art.

Specifically, CMOS inverters, other CMOS logic circuits, and other CMOS logic-like circuits can act as threshold detectors, implicitly comparing an input which is a sensor output signal to the level at which the logic circuit output changes state.

Logic devices with minimum transistor size are useful in reducing chip area requirements, especially in conjunction with the efficient architecture of local threshold detectors in sensor cells. Additionally, power consumption can be reduced by having CMOS logic circuits with pull-down n-type transistors and pull-up p-type transistors.

The invention is particularly useful in CMOS imaging sensor technologies, wherein it is possible to manufacture both sensors and conversion circuitry simultaneously on a single chip, and wherein manufacturing tolerances for the various proposed circuit elements both analog and digital are well understood.

The description above contains many specific details relating to sensors, A/D conversion techniques, precision, exposure times, incident energy, array sizes, array geometries, circuit design, threshold levels, and applications. These should not be construed as limiting the scope of the invention, but as illustrating some of the presently preferred embodiments of the invention. The scope of the invention should be determined by the appended claims and their legal equivalents, rather than by the examples given.

I claim:

1. A machine for digital imaging, comprising:
    a. a photodetector having a photodetector output directly connected to the gate of a first transistor and directly connected to the gate of a second transistor, where said first transistor is a member of the set consisting of a pull-down transistor and an n-type MOS transistor and where said second transistor is a member of the set consisting of a pull-up transistor and a p-type MOS transistor
    b. a positive power supply bus and a ground wire for supplying power to said first transistor and to said second transistor
    c. a reset reference bus which is not said positive power supply bus and which is not said ground wire
    d. means for connecting said photodetector to said reset reference bus to reset said photodetector output to an initial value appearing on said reset reference bus.

2. The machine of claim 1 in which said first transistor is a pull-down transistor.

3. The machine of claim 1 in which said second transistor is a pull-up transistor.

4. The machine of claim 3 in which said first transistor is a pull-down transistor.

5. The machine of claim 1 in which said first transistor and said second transistor are parts of a logic gate.

6. The machine of claim 5 in which said logic gate is an inverter.

7. The machine of claim 1 in which said first transistor and said second transistor are parts of a threshold detector.

8. The machine of claim 1 in which said first transistor is an n-type MOS transistor.

9. The machine of claim 1 in which said second transistor is a p-type MOS transistor.

10. The machine of claim 9 in which said first transistor is an n-type MOS transistor.

11. A machine for time-to-threshold analog-to-digital conversion in a digital imaging system, comprising:
    a. a photodetector having a first photodetector output
    b. a threshold detector having a first analog input and a first digital output, said threshold detector comprising:
        i. a first transistor having a first gate, said first transistor being a member of the set consisting of n-type MOS transistors and pull-down transistors
        ii. a second transistor having a second gate, said second transistor being a member of the set consisting of p-type MOS transistors and pull-up transistors
    c. means for applying said first photodetector output as said first analog input so that the signal at said first gate is said first photodetector output and so that the signal at said second gate is said first photodetector output
    d. a positive power supply bus and a ground wire for supplying power to said first transistor and to said second transistor
    e. a reset reference bus which is not said positive power supply bus and which is not said ground wire
    f. means for connecting said photodetector to said reset reference bus to reset said photodetector output to an initial value appearing on said reset reference bus.

12. The machine of claim 11 in which said threshold detector comprises an inverter.

13. The machine of claim 12 in which said inverter comprises said first transistor and said second transistor.

14. The machine of claim 11 in which said threshold detector comprises a logic gate.

15. The machine of claim 14 in which said logic gate comprises said first transistor and said second transistor.

16. The machine of claim 11 in which said first transistor and said second transistor are located substantially adjacent to said first photodetector, whereby long wires connecting said first photodetector, said first gate, and said second gate are not required.

17. The machine of claim 11 in which said second transistor is a minimum-size transistor.

18. The machine of claim 17 in which said first transistor is a minimum-size transistor.

19. The machine of claim 11 in which said threshold detector is an inverter.

20. A machine for time-to-threshold analog-to-digital conversion in a digital imaging system, comprising:
    a. a multiplicity of threshold detectors, each having:

i. an input line directly connected to the gates of at least two transistors
   ii. a digital output
b. a multiplicity of photodetectors, each having a photodetector output provided as input to the input line of one of said multiplicity of threshold detectors
c. means for measuring a multiplicity of elapsed times when said digital outputs of said threshold detectors change states
d. a positive power supply bus and a ground wire for supplying power to said at least two transistors in each of said multiplicity of threshold detectors
e. a reset reference bus which is not said positive power supply bus and which is not said ground wire
f. means for connecting each of said multiplicity of photodetectors to said reset reference bus to reset the photodetector output of said each of said multiplicity of photodetectors to an initial value appearing on said reset reference bus whereby for each of said threshold detectors, the signal appearing at both of said gates is one of said photodetector outputs.

21. The machine of claim 20 in which said threshold detectors do not have an explicit reference signal which is not a power supply voltage, whereby said threshold detectors are single-input threshold detectors with implicit thresholds.

22. The machine of claim 20 in which said threshold detectors are digital logic gates.

23. The machine of claim 20 in which said threshold detectors are inverters.

24. The machine of claim 23 in which said inverters consist of minimum-size transistors.

25. The machine of claim 20 in which said at least two transistors of at least one of said multiplicity of threshold detectors comprise:
   a. at least one transistor from the set consisting of n-type MOS transistors and pull-down transistors, and
   b. at least one transistor from the set consisting of p-type MOS transistors and pull-up transistors.

* * * * *